(12) United States Patent
Monchy et al.

(10) Patent No.: US 12,259,098 B2
(45) Date of Patent: Mar. 25, 2025

(54) ELECTRICAL CONNECTION ASSEMBLY FOR LIGHT MODULE FOR MOTOR VEHICLE AND METHOD

(71) Applicant: VALEO VISION, Bobigny (FR)

(72) Inventors: Etienne Monchy, Bobigny (FR); Berta Fernandez Ortiz, Bobigny (FR); Juliette Josephine, Bobigny (FR)

(73) Assignee: Valeo Vision, Bobigny (FR)

( * ) Notice: Subject to any disclaimer, the term of this patent is extended or adjusted under 35 U.S.C. 154(b) by 512 days.

(21) Appl. No.: 17/625,372

(22) PCT Filed: Jul. 8, 2020

(86) PCT No.: PCT/EP2020/069312
§ 371 (c)(1),
(2) Date: Jun. 13, 2022

(87) PCT Pub. No.: WO2021/005134
PCT Pub. Date: Jan. 14, 2021

(65) Prior Publication Data
US 2022/0325862 A1   Oct. 13, 2022

(30) Foreign Application Priority Data

Jul. 9, 2019  (FR) ....................................... 1907687
Jul. 9, 2019  (FR) ....................................... 1907689
Jul. 9, 2019  (FR) ....................................... 1907691

(51) Int. Cl.
*F21S 41/19*   (2018.01)
*G01R 31/67*   (2020.01)
(Continued)

(52) U.S. Cl.
CPC ............ *F21S 41/192* (2018.01); *G01R 31/67* (2020.01); *H01R 13/641* (2013.01); *H01R 13/68* (2013.01);
(Continued)

(58) Field of Classification Search
CPC ....... F21S 41/192; G01R 31/67; H01R 13/68; H01R 13/641
See application file for complete search history.

(56) References Cited

U.S. PATENT DOCUMENTS 4,195,648 A      4/1980 Joncas et al.
4,915,648 A  *   4/1990 Takase ................. H01R 13/641
                                                 439/924.1
(Continued)

FOREIGN PATENT DOCUMENTS

EP      2595251 A1    5/2013
FR      2909228 A1    5/2008
(Continued)

OTHER PUBLICATIONS

Japanese Patent Office, Office Action (with English translation) of corresponding Japanese Patent Application No. 2022-501058, dated Jan. 27, 2023.
(Continued)

*Primary Examiner* — Evan P Dzierzynski
*Assistant Examiner* — Nathaniel J Lee
(74) *Attorney, Agent, or Firm* — Valeo Vision

(57) ABSTRACT

The invention provides an electrical connection assembly comprising a connector and a printed circuit board for a light module for motor vehicles, and a diagnostic method for checking the hold of a connector in a socket by means of a check electrical signal, using minimal electronic components.

15 Claims, 6 Drawing Sheets

(51) Int. Cl.
*H01R 13/641* (2006.01)
*H01R 13/68* (2011.01)
*F21Y 115/10* (2016.01)

(52) U.S. Cl.
CPC ....... *F21Y 2115/10* (2016.08); *H01R 2201/26* (2013.01)

(56) References Cited

U.S. PATENT DOCUMENTS

| | | | | |
|---|---|---|---|---|
| 4,949,035 | A | * | 8/1990 | Palmer, II. ........... H01R 13/641 340/687 |
| 5,144,189 | A | | 9/1992 | Van Heeswijk et al. |
| 6,433,445 | B1 | | 8/2002 | Ahladas et al. |
| 2005/0032415 | A1 | | 2/2005 | Sakamoto |
| 2009/0296416 | A1 | * | 12/2009 | Luo .................. F21S 43/30 362/487 |
| 2013/0242440 | A1 | * | 9/2013 | Bonasia ............. H01R 13/6633 361/49 |
| 2019/0100160 | A1 | | 4/2019 | Sakai |

FOREIGN PATENT DOCUMENTS

| | | |
|---|---|---|
| FR | 3056702 A1 | 3/2018 |
| JP | 2000173717 A | 6/2000 |
| JP | 2001294082 A | 10/2001 |
| JP | 2005331703 A | 12/2005 |
| JP | 4650344 B2 | 3/2011 |

OTHER PUBLICATIONS

European Patent Office, International Search Report (with English translation) and Written Opinion of corresponding International Application No. PCT/EP2020/069312, dated Sep. 18, 2020.

Japanese Patent Office, Second Office Action (with English translation) of corresponding Japanese Patent Application No. 2022-501058 , dated Jul. 10, 2023.

* cited by examiner

ELECTRICAL CONNECTION ASSEMBLY FOR LIGHT MODULE FOR MOTOR VEHICLE AND METHOD

CROSS-REFERENCE TO RELATED APPLICATIONS

This is a 371 application (submitted under 35 U.S.C. § 371) of International Application No. PCT/EP2020/069312 (WO2021/005134) filed on Jul. 8, 2020, which claims the priority date benefit of French Application Nos. 1907687, 1907689 and 1907691, filed on Jul. 9, 2019, the disclosures of which are hereby incorporated by reference in their entirety.

TECHNICAL FIELD

The invention relates to electrical connectors, in particular between electronic components of a lighting module for a motor vehicle. The invention relates in particular to the use of CPA ("connection position assurance") connectors, having a position assurance device.

BACKGROUND OF THE INVENTION

A lighting module for a motor vehicle is a complex device involving a plurality of technologies in a very limited space. It comprises, inter alia, optical components, lighting components such as light-emitting diodes, LEDs, electronic circuits for driving light sources, mechanical supports, and elements for dissipating humidity and heat. Assembling such a module is a complex task that requires a high degree of attention and precision. This is particularly the case for the electrical interconnection of various electrical components and/or printed circuits involved in such a lighting module. By way of example, a circuit for driving the supply of electric power to light sources should be connected, by way of a connector, to a printed circuit that houses the light sources to be supplied with electricity. An operator often has to make these connections without having direct visual contact with the connector and the corresponding socket—the operation has to be performed blind as other components are already assembled in the limited available volume of the module. The connection of a harness between two printed circuits has to withstand external stresses. For example, it has to reliably withstand the vibrations to which the lighting module will be subjected during driving of the motor vehicle to whose equipment it belongs. It is therefore important to be able to ensure a correct connection at the time of assembly

BRIEF SUMMARY OF THE INVENTION

It is known to use electrical connectors having a CPA ("connection position assurance") position assurance device. Such connectors typically have a plurality of contacts having a first length and a shorter verification contact, which makes reliable electrical contact with a corresponding terminal of a socket only if the plug is pushed a certain depth into the socket. One known CPA connector socket also comprises a frame having lateral lugs that interact with a receiving structure corresponding to the lugs at the level of the plug. The snapping in of a first distal lug ensures that the connectors of the first length are in electrical contact with the corresponding terminals of the socket. The snapping in of a second proximal lug ensures that all of the connectors are in electrical contact with the corresponding terminals of the socket.

In order to minimize the risk of errors or incorrect connection during the assembly of a lighting module for a motor vehicle, it may be beneficial to use an electrical signal on the verification contact in order to test the degree to which the plug is pushed into the socket. In general, a surplus of electronic components at the level of the lighting module should however be avoided since the production overhead increases with each component and is amplified during the mass production of such a module.

The aim of the invention is to overcome at least one of the problems posed by the prior art. More precisely, the aim of the invention is to propose an electrical connection assembly that makes it possible to verify the holding of a connector in a socket by way of an electrical verification signal, and using a minimum number of electronic components.

According to a first aspect of the invention, what is proposed is an electrical connection assembly. The assembly comprises a connector and a printed circuit that comprises a socket corresponding to the connector and a first electronic subcircuit that contributes to performing a lighting function for a motor vehicle. The connector comprises a verification contact intended to transmit an electrical signal for verifying the electrical connection between the connector and the printed circuit, wherein the printed circuit comprises a second subcircuit having a contact terminal intended to be connected to said verification contact in the event of the connector being held in the socket.

Preferably, the second subcircuit does not actively contribute to performing said lighting function.

Preferably, the connector and the socket may comprise a mutual mechanical engagement structure, which makes it possible to produce a first mechanical engagement corresponding to a first, lesser degree, and a second mechanical engagement corresponding to a second, greater degree of pushing of the connector into the socket. The arrangement of the verification contact and of the contact terminal of the second subcircuit may preferably be such that they are in electrical contact if the second mechanical engagement of the structure is engaged.

The socket may preferably comprise a plurality of contacts extending over a first length, and the contact terminal may extend over a second, shorter length.

The second subcircuit may preferably be arranged so as to be connected to ground potential when the connector is plugged into the socket.

Preferably, the second subcircuit is arranged so as to connect the contact terminal to ground potential through a branch comprising a resistive component.

The second subcircuit may preferably be arranged so as to connect the contact terminal to ground potential through at least one branch that comprises a capacitor, an inductor, a resistor, or a combination of the above.

Preferably, the connector may comprise a first contact intended to supply a first, non-zero electrical potential to the first subcircuit, and a second contact intended to supply a second, non-zero electrical potential to the first subcircuit. The arrangement may preferably be such that the verification contact is connected to the first electrical potential when the connector is plugged into the socket.

The second subcircuit may preferably be arranged so as to be connected to the second electrical potential when the connector is plugged into the socket.

Preferably, the second subcircuit may comprise a resistive component.

The second subcircuit may preferably comprise a fuse.

Preferably, the second subcircuit may comprise at least one branch comprising a capacitor, an inductor, a resistor, or a combination of the above.

Preferably, the second subcircuit is arranged so as to connect the contact terminal to ground potential through a branch comprising a resistive component.

Preferably, the arrangement of the first subcircuit may be such that an electric current flows therethrough only in a first direction, and the arrangement of the second subcircuit, parallel to the first subcircuit, may be such that an electric current flows therethrough only in a second direction opposite the first direction.

The second subcircuit may preferably comprise a diode.

The first subcircuit may preferably comprise at least one electroluminescent semiconductor element-based light source. This may preferably be a light-emitting diode, LED.

Preferably, the diode of the second subcircuit is connected in parallel with, and in the opposite direction to, the electroluminescent semiconductor element-based light source.

Preferably, the second subcircuit comprises an electronic component intended to self-destruct upon the flow of an electric current having at least a predetermined threshold strength.

Preferably, the threshold strength may be less than the strength of the charging current required for the operation of said lighting function.

Preferably, said electronic component may comprise a resistive component.

The electronic component may preferably comprise a fuse.

Preferably, the electronic component (F) may comprise a conductive track of the printed circuit. The track may preferably have a cross section dimensioned so as to self-destruct upon the flow of an electric current having a strength higher than said threshold strength.

According to another aspect of the invention, what is proposed is a lighting module for a motor vehicle. The module comprises a plurality of connection assemblies according to any aspect of the invention. Preferably, the first subcircuit of each assembly may perform a distinct light function for one and the same motor vehicle.

Preferably, the second subcircuit of each connection assembly may have an identical resistance.

Preferably, the second subcircuit of each connection assembly has a different resistance allowing the connection assembly to be identified.

According to another aspect of the invention, what is proposed is a method for diagnosing the connection between a connector and a printed circuit forming a connection assembly according to any aspect of the invention. The method comprises the following steps:
  making available a connection between the connector and the printed circuit;
  providing an electrical verification signal, having first characteristics, at the verification contact;
  using a measuring instrument to measure an output electrical signal from the second subcircuit of the printed circuit;
  using a data processing unit to compare the verification signal and the output signal, and to conclude as to a correct or incorrect connection depending on the result of the comparison.

According to another aspect of the invention, what is proposed is a method for diagnosing connections between the respective connectors and printed circuits of a lighting module according to one aspect of the invention. The method comprises the following steps:
  making available a connection between the connectors and the printed circuits;
  providing an electrical verification signal, having first characteristics, at the verification contact of each connection assembly;
  using a measuring instrument to measure an output electrical signal from the second subcircuit of the printed circuit of each connection assembly;
  using a data processing unit to compare the verification signal and the output signal, and to conclude as to a correct or incorrect connection of the printed circuits depending on the result of the comparison.

Preferably, the lighting module may comprise second subcircuits each having an identical resistance, and the method may comprise the additional step of:
  using the data processing unit to determine the number of correctly connected printed circuits depending on the result of the comparison.

Preferably, the lighting module may comprise second subcircuits each having a distinct resistance, and the method may comprise the additional step of:
  using the data processing unit to identify the correctly connected printed circuits depending on the result of the comparison.

The measuring instrument may preferably comprise an ammeter, a voltmeter or an ohmmeter.

The data processing unit may preferably comprise a data processor configured by way of appropriate software.

Preferably, said electrical verification signal may comprise an electric current having a strength lower than said threshold strength.

Preferably, the method may comprise an additional step of representing the conclusion in auditory and/or visual form by way of auditory and/or visual output means. This may preferably be a loudspeaker or a screen operatively connected to said processor. The visual representation may preferably comprise a green signal in the event of successful connection, and a red signal in the event of failed connection.

The aspects of the invention propose an electrical connection assembly that makes it possible to verify the holding of a connector in a socket by way of an electrical verification signal, using a minimum number of electronic components. Using the measures proposed by the present invention means that it becomes possible to ensure the quality of an electrical connection of a connection harness to a printed circuit when assembling a lighting module for a motor vehicle. This is facilitated for example by visual feedback regarding the quality of a connection, which is carried out blind. According to some preferred embodiments of the invention, the proposed connection assembly and diagnostic method use a minimum number of added electronic components in comparison with a functional printed circuit that is not able to be diagnosed. This approach minimizes the production overhead of the proposed solution.

BRIEF DESCRIPTION OF THE DRAWINGS

Other features and advantages of the present invention will be better understood with the aid of the description of the examples and of the drawings, in which.

DETAILED DESCRIPTION OF THE INVENTION

Figure 1:
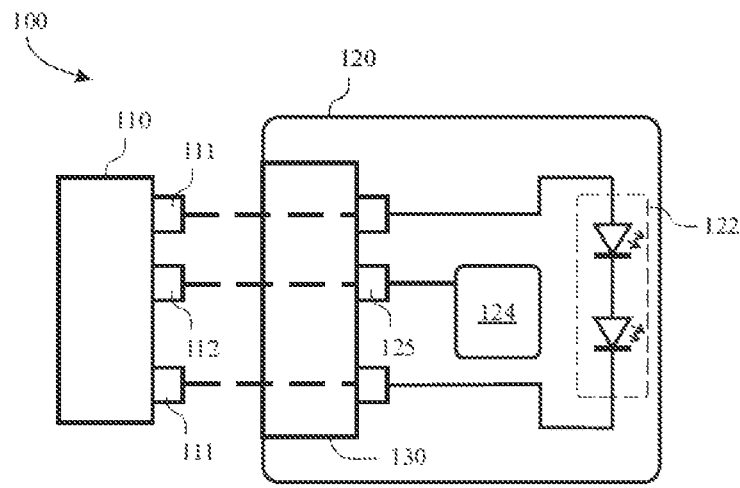
FIG. 1 schematically shows a connection device in accordance with one preferred embodiment of the invention.

Unless specified otherwise, technical features that are described in detail for one given embodiment may be combined with the technical features that are described in the context of other embodiments described by way of example and without limitation. Similar reference numerals will be used to describe similar concepts across various embodiments of the invention. For example, the references 100, 200, 300 up to 1100 denote eleven embodiments of a connection assembly according to the invention.

The illustration of FIG. 1 shows an electrical connection assembly 100 according to a first preferred embodiment of the invention. The assembly comprises a connector or a plug 110 that typically marks the termination of a connection harness and that comprises a plurality of electrical contacts 111, and also a verification contact 112 intended to transmit an electrical signal for verifying the electrical connection between the connector and a printed circuit. The assembly 100 also comprises a printed circuit 120, for example a PCB ("printed circuit board"), without being limited to this example. The printed circuit 120 comprises a first electronic subcircuit 122 that actively contributes to performing a lighting function for a motor vehicle, although other applications in which the proposed connection assembly might be useful may also be contemplated. In the non-limiting example shown, the first subcircuit 122 comprises light-emitting diodes, which are supplied with electric power by an electrical potential difference supplied to their terminals from an electric power supply circuit, not illustrated. It is the connector 110, by way of the electrical contacts 111, that makes it possible to connect the power source to the first subcircuit 122 of the printed circuit 120. The printed circuit 120 furthermore comprises a second electronic subcircuit 124 whose electronic components do not actively contribute to the lighting function performed by the first subcircuit 122. The main function of the second subcircuit is that of electrically interacting with the verification contact, by way of a corresponding contact terminal 125, when the connector 110 is held by the corresponding socket 130 installed on the printed circuit 120.

During an assembly process and in particular a process of connecting the harness ending with the connector 110, on the one hand, to the printed circuit 120, on the other hand, the correct connection diagnosis is made as follows. Following the manual connection, by an operator, of the connector 110 into the socket 130, a predetermined electrical verification signal is supplied by a device, not illustrated, to the verification contact 112. If the connection is correct, the verification contact is in contact with the terminal 125 of the second subcircuit 124 of the printed circuit, and the electrical signal experiences a change upon passing through this subcircuit. A measuring device, not illustrated, makes it possible to measure the trend of the electrical signal thus modified and to conclude that the connection has succeeded (the verification signal has been modified in a predetermined manner) or failed (the signal has not passed through the second subcircuit 124). Preferably, the measuring device is configured, by way of a preconfigured data processor, so as to provide a visual or auditory notification to the operator by way of an appropriate interface. The notification indicates the result of the test, thereby allowing the operator to make the connection again, if necessary. While other examples are possible, the electrical verification signal comprises for example a voltage of a predetermined strength, which experiences a drop when the electric current flows through the second circuit 124 in the event of correct connection. This drop in electrical potential may be measured by means known in the art.

Figure 2:
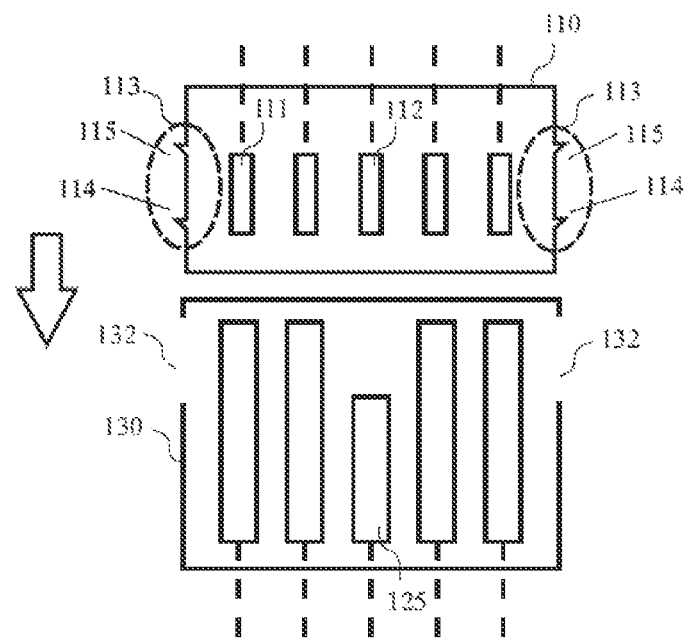
FIG. 2 shows a cross section through a connector and a socket corresponding thereto, these being known from the prior art.

FIG. 2 shows an electrical connector 110 and a socket 130 that corresponds to the connector. This device is known from the prior art and may be used without limitation in the embodiments of the present invention. When the connector is plugged into the socket, their respective contacts come into mechanical and electrical contact. For this purpose, it is for example advantageous for a pair of complementary contacts to be formed by a hollow tubular contact, on the one hand, and by a wired contact having a diameter allowing sliding in contact in the tubular contact, on the other hand, thus allowing various levels of pushing in. The connector 110 comprises a frame with two opposing lateral edges from which two lugs, one distal 114 and the other proximal 115, are formed. These lugs make it possible to engage in a receiving structure 132 or corresponding opening in the frame of the socket 130. If the distal lugs 114 engage in the receiving structure, the electrical connection of a first set of contacts 111 with complementary contacts of the socket having a first length may be ensured. If the proximal lugs 115 also engage in the receiving structure 132, the connection of the first set of contacts 111 as well as the verification contact 112, which comes into contact with the corresponding shorter contact 125 of the socket, may be ensured. The spacing between the lugs 114, 115 along the direction in which the frame of the connector 110 extends is chosen so as to correspond to the difference in length between the usual contacts and the contact terminal 125 of the socket 130. The contact terminal may in particular constitute a verification contact of the socket. While, in the example shown, all of the contacts of the socket or of the connector are aligned, this is not a necessary limitation. The lugs 114, 115 and the corresponding receiving means on the socket 130 thus form a mutual mechanical engagement structure 113, 132, which makes it possible to produce a first mechanical engagement corresponding to a first, lesser degree of pushing in, and a second mechanical engagement corresponding to a second, greater degree of pushing of the connector 110 into the socket 130. Since the terms "lesser" and "greater" are relative, they should be understood in relation to one another: with the second degree of pushing in, the connector is pushed further or deeper into the socket than with the first degree of pushing in.

Figure 3:
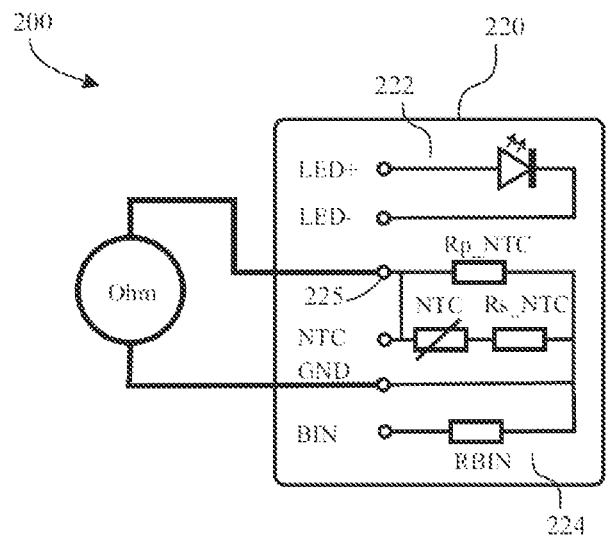
FIG. 3 schematically shows a connection device in accordance with one preferred embodiment of the invention.

The illustration of FIG. 3 shows an electrical connection assembly 200 according to a second preferred embodiment of the invention. The assembly comprises a connector or a plug, not illustrated, that typically marks the termination of a connection harness and that comprises a plurality of electrical contacts, and also a verification contact intended to transmit an electrical signal for verifying the electrical connection between the connector and a printed circuit. The assembly 100 also comprises a printed circuit 220. A first electronic subcircuit 222 comprises at least one light-emitting diode that actively contributes to performing a lighting function for a motor vehicle. The printed circuit 220 furthermore comprises a second electronic subcircuit 224 whose electronic components do not actively contribute to the lighting function performed by the first subcircuit 222. In the example shown, this is a set of resistive components, in this case a thermistor and a network of resistors. These components may have a passive function in the calibration of the electric current supplying the first subcircuit 222 if their temperature is representative of the semiconductor junction temperature of the light-emitting diodes. One of the contacts of the connector makes it possible to connect the second subcircuit 224 to ground potential GND, while the verification contact is connected to the contact terminal 225 if the connector is held in the socket.

During an assembly process and in particular a process of connecting the harness ending with the connector, on the one hand, to the printed circuit 220, on the other hand, the correct connection diagnosis is made as follows. Following the manual connection, by an operator, of the connector into the socket of the printed circuit 220, an electric current having a predetermined strength, supplied by a source, not illustrated, for example by a battery, is supplied to the verification contact. If the connection is correct, the verification contact is in contact with the terminal 225 of the second subcircuit 122 of the printed circuit, and the resistance of the thermistors becomes able to be measured using an ohmmeter connected to the verification and GND contacts, respectively, of the connector.

Figure 4:
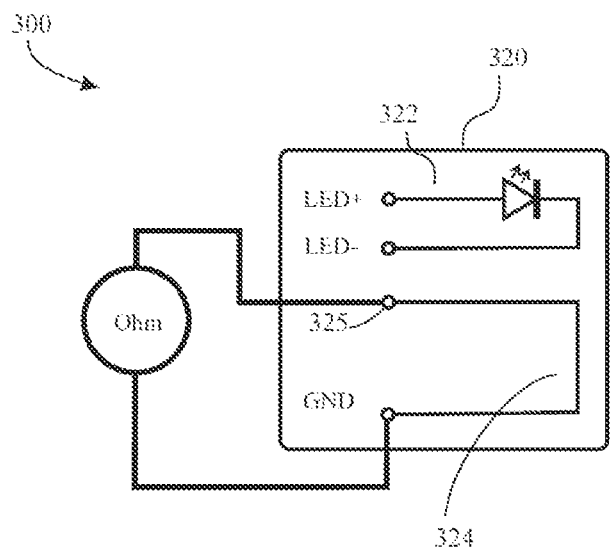
FIG. 4 schematically shows a connection device in accordance with one preferred embodiment of the invention.

The illustration of FIG. 4 shows an electrical connection assembly 300 according to a third preferred embodiment of the invention. The assembly comprises a connector or a plug, not illustrated, that typically marks the termination of a connection harness and that comprises a plurality of electrical contacts, and also a verification contact intended to transmit an electrical signal for verifying the electrical connection between the connector and a printed circuit. The assembly 300 also comprises a printed circuit 320. A first electronic subcircuit 322 comprises at least one light-emitting diode that actively contributes to performing a lighting function for a motor vehicle. The printed circuit 320 furthermore comprises a second electronic subcircuit 324 comprising an electrically conductive and resistive track. One of the contacts of the connector makes it possible to connect the second subcircuit 324 to ground potential GND, while the verification contact is connected to the contact terminal 325 if the connector is held in the socket.

During an assembly process and in particular a process of connecting the harness ending with the connector, on the one hand, to the printed circuit 320, on the other hand, the correct connection diagnosis is made as follows. Following the manual connection, by an operator, of the connector into the socket of the printed circuit 320, an electric current having a predetermined strength, supplied by a source, not illustrated, for example by a battery, is supplied to the verification contact. If the connection is correct, the verification contact is in contact with the terminal 325 of the second subcircuit 322 of the printed circuit, and the resistance of the subcircuit becomes able to be measured using an ohmmeter connected to the verification and GND contacts, respectively, of the connector.

Figure 5:
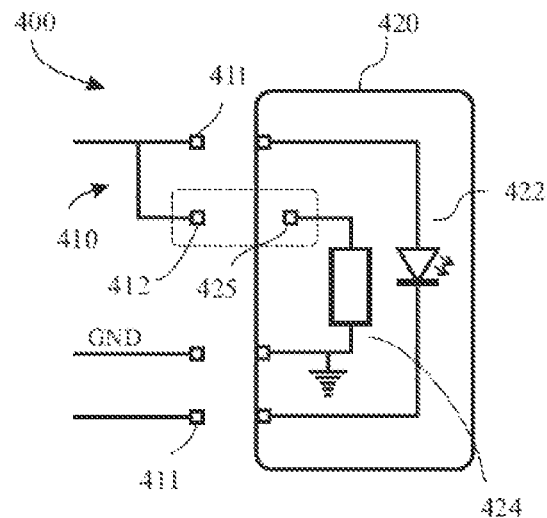
FIG. 5 schematically shows a connection device in accordance with one preferred embodiment of the invention.

The illustration of FIG. 5 shows an electrical connection assembly 400 according to a fourth preferred embodiment of the invention. The assembly comprises a connector or a plug 410 that typically marks the termination of a connection harness and that comprises a plurality of electrical contacts 411, and also a verification contact 412 intended to transmit an electrical signal for verifying the electrical connection between the connector and a printed circuit. In the example shown, on one of the contacts 411 shown at the top of the figure, a splice is made in order to generate the contact 412 at the same electrical potential. The assembly 400 also comprises a printed circuit 420, for example a PCB ("printed circuit board"), without being limited to this example. A first electronic subcircuit 422 comprises at least one light-emitting diode that actively contributes to performing a lighting function for a motor vehicle. The first subcircuit is supplied with power by a potential difference between the contacts 411 at the top and the bottom of the figure, respectively. The printed circuit 420 furthermore comprises a second electronic subcircuit 424 whose electronic components do not actively contribute to the lighting function performed by the first subcircuit 422. The second subcircuit comprises a contact terminal 425 that is connected to the verification contact 412 in the event of correct connection between the connector 410 in the socket of the printed circuit. The second subcircuit is connected to the ground potential supplied by one of the contacts of the connector through a resistor. The impedance of the resistor is preferably large, of the order of several MΩ, in order to limit the current that is dissipated in this subcircuit.

During an assembly process and in particular a process of connecting the harness ending with the connector 410, on the one hand, to the printed circuit 420, on the other hand, the correct connection diagnosis is made as follows. Following the manual connection, by an operator, of the connector 410 into the socket, not illustrated, of the printed circuit, in a first step, a first potential difference is applied between the contact 411, and therefore also 412, and ground potential. The potential on the contact 411 is chosen such that the potential difference across the terminals of the first subcircuit is less than the forward voltage of the light-emitting diodes. Since the value of the resistor is known, a measurement of the voltage drop between the contacts 412 and GND makes it possible to verify whether the connection was successful. Following the correct and verified connection of the connector and the printed circuit, in a second step corresponding to the operation of the lighting module in question, the electrical potential applied to the contact 411 is such that the potential difference across the terminals of the first subcircuit 422 is high enough for an electric current to flow through the light-emitting diodes. After the diagnosis, a low-strength electric current flows through the second subcircuit.

It goes without saying that other configurations of the second subcircuit 424 may be provided by those skilled in the art without otherwise departing from the scope of the present invention. This also applies to the other embodiments described in the context of a second purely resistive subcircuit. The second subcircuit may in particular comprise an RL, RC, LC or RLC circuit, known in the art, provided that the electrical verification signal used in the diagnostic phase is such that it makes it possible to detect whether or not the subcircuit in question is supplied with power. Obviously, suitable measuring instruments, such as a voltmeter or an ammeter, may be used as needed and according to the chosen subcircuits.

Figure 6:
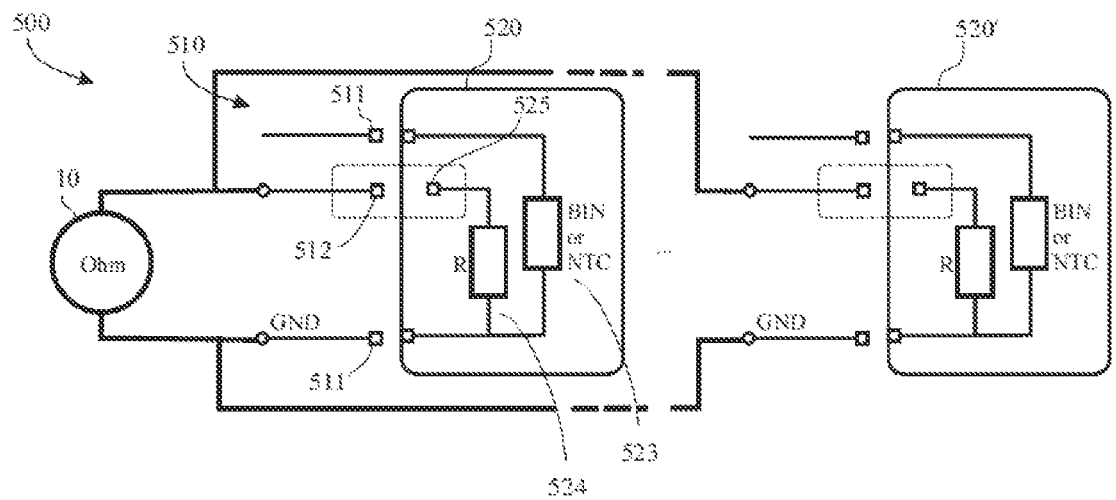
FIG. 6 schematically shows a connection device in accordance with one preferred embodiment of the invention.

The illustration of FIG. 6 shows an electrical connection assembly 500 according to a fifth preferred embodiment of the invention. The assembly comprises a connector or a plug 510 that typically marks the termination of a connection harness and that comprises a plurality of electrical contacts 511, and also a verification contact 512 intended to transmit an electrical signal for verifying the electrical connection between the connector and a printed circuit. The assembly 500 also comprises a printed circuit 520. A first electronic subcircuit, not illustrated, actively contributes to performing a lighting function for a motor vehicle. In the example shown, the printed circuit furthermore comprises a subcircuit 523 comprising electronic components that passively contribute to the lighting function for the motor vehicle. These are for example a resistor RBIN or a thermistor, the measurement of which is useful in a phase of calibrating the electric current supplied to light sources. The printed circuit 520 furthermore comprises a second electronic subcircuit 524 whose electronic components do not actively or passively contribute to the lighting function. The second subcircuit is independent of the other subcircuits of the printed circuit. The second subcircuit comprises a contact terminal 525 that is connected to the verification contact 512 in the event of correct connection between the connector 510 in the socket of the printed circuit. The second subcircuit is connected to the ground potential supplied by one of the contacts of the connector through a resistor of predetermined impedance.

During an assembly process and in particular a process of connecting the harness ending with the connector 510, on the one hand, to the printed circuit 520, on the other hand, the correct connection diagnosis is made as follows. Following the manual connection, by an operator, of the connector 510 into the socket, not illustrated, of the printed circuit, in a first step, a first potential difference is applied between the contact 512 and ground potential. Since the value of the calibrated resistor R is known, a measurement of the voltage drop between the contacts 512 and GND makes it possible to verify whether the connection was successful. Following the correct and verified connection of the connector and the printed circuit, in a second step corresponding to the operation of the lighting module in question, the verification contact 512 is no longer supplied with power and the electrical potential applied to the contact 511 is such that either the value RBIN or the resistance of the thermistor are able to be measured, or such that the potential difference across the terminals of the first subcircuit is high enough for an electric current to flow through the light-emitting diodes.

After the diagnosis, no further electric current flows through the second subcircuit 524. Moreover, a single connection wire may be used to connect a measuring instrument 10 in parallel with a plurality of printed circuits 520, 520' as shown in FIG. 6. If the values of the calibrated resistors R of all of the printed circuits 520, 520' are identical, the equivalent resistance seen by the measuring instrument is equal to R/n, where n is the number of printed circuits in parallel. The instrument may therefore conclude and indicate the number of correct connections. As an alternative, each printed circuit 520 has a calibrated resistor R with a different value. The measuring instrument may thus identify, through a calculation known per se in the art, which of the connections have failed or succeeded. An auditory and/or visual notification is then generated.

Figure 7:
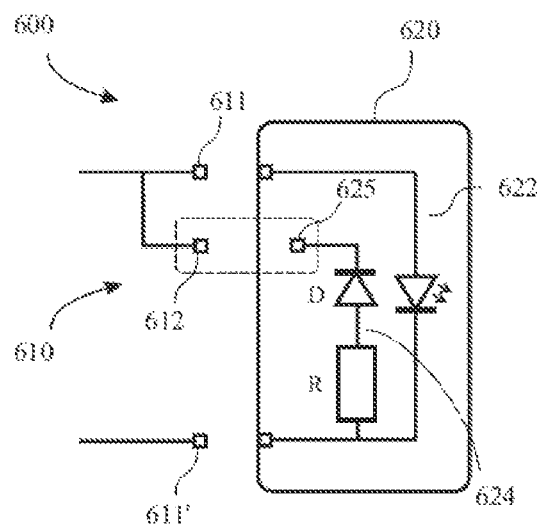
FIG. 7 schematically shows a connection device in accordance with one preferred embodiment of the invention.

The illustration of FIG. 7 shows an electrical connection assembly 600 according to a sixth preferred embodiment of the invention. The assembly comprises a connector or a plug 610 that typically marks the termination of a connection harness and that comprises a plurality of electrical contacts 611, 611', and also a verification contact 612 intended to transmit an electrical signal for verifying the electrical connection between the connector and a printed circuit. In the example shown, on one of the contacts 611 shown at the top of the figure, a splice is made in order to generate the contact 612 at the same electrical potential. The assembly 600 also comprises a printed circuit 620, for example a PCB ("printed circuit board"), without being limited to this example. A first electronic subcircuit 622 comprises at least one light-emitting diode that actively contributes to performing a lighting function for a motor vehicle. The orientation of the light-emitting diode in a first direction implies that an electric current is able to flow through the first subcircuit only in this first direction. As an alternative, a non-semi-conducting light source may be connected in series with a diode connected in this first direction. The first subcircuit is supplied with power by a potential difference between the contacts 611 and 611'. The printed circuit 620 furthermore comprises a second electronic subcircuit 624 whose electronic components do not actively contribute to the lighting function performed by the first subcircuit 622. The second subcircuit comprises a contact terminal 625 that is connected to the verification contact 612 in the event of correct connection between the connector 610 in the socket of the printed circuit. The second subcircuit is connected to the contact 611' through a diode D and a resistor R. The diode D is connected in the opposing direction with respect to the light-emitting diodes of the first subcircuit 622.

During an assembly process and in particular a process of connecting the harness ending with the connector 610, on the one hand, to the printed circuit 620, on the other hand, the correct connection diagnosis is made as follows. Following the manual connection, by an operator, of the connector 610 into the socket, not illustrated, of the printed circuit, in a first step, a first potential difference is applied between the contact 611' and the verification contact 612, such that the diode D allows an electric current to flow while the light-emitting diodes of the first subcircuit 622 block the flow thereof. Since the value of the resistor is known, a measurement of the voltage drop between the contacts 611' and 612 makes it possible to verify whether the connection was successful. Following the correct and verified connection of the connector and the printed circuit, in a second step corresponding to the operation of the lighting module in question, the electrical potential applied between the contact 611 and 611' is such that an electric current flows through the light-emitting diodes while the diode D of the second subcircuit opposes the flow thereof. After the diagnosis, only a small electric current, corresponding to a leakage current of the diode D, is able to flow through the second subcircuit.

Figure 8:
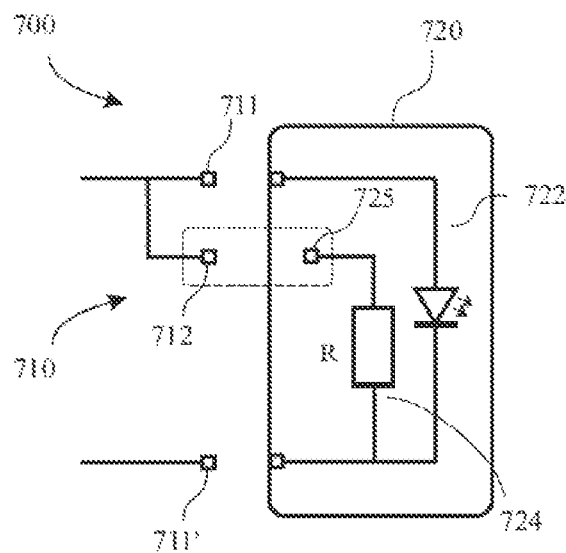
FIG. 8 schematically shows a connection device in accordance with one preferred embodiment of the invention.

The illustration of FIG. 8 shows an electrical connection assembly 700 according to a seventh preferred embodiment of the invention. The assembly comprises a connector or a plug 710 that typically marks the termination of a connection harness and that comprises a plurality of electrical contacts 711, 711', and also a verification contact 712 intended to transmit an electrical signal for verifying the electrical connection between the connector and a printed circuit. In the example shown, on one of the contacts 711 shown at the top of the figure, a splice is made in order to generate the contact 712 at the same electrical potential. The assembly 700 also comprises a printed circuit 720. A first electronic subcircuit 722 comprises at least one light-emitting diode that actively contributes to performing a lighting function for a motor vehicle. The first subcircuit is supplied with power by a potential difference between the contacts 711 and 711'. The printed circuit 720 furthermore comprises a second electronic subcircuit 724 whose electronic components do not actively contribute to the lighting function performed by the first subcircuit 722. The second subcircuit comprises a contact terminal 725 that is connected to the verification contact 712 in the event of correct connection between the connector 710 in the socket of the printed circuit. The second subcircuit connects the verification contact 712 to the contact 711' through a calibrated resistor of high impedance, of the order of a few MΩ, in order to limit the electric current that is dissipated in this subcircuit.

During an assembly process and in particular a process of connecting the harness ending with the connector 710, on the one hand, to the printed circuit 720, on the other hand, the correct connection diagnosis is made as follows. Following the manual connection, by an operator, of the connector 710 into the socket, not illustrated, of the printed circuit, in a first step, a first potential difference is applied between the contact 711, and therefore also 712, on the one hand, and the contact 711', on the other hand. The potential difference is chosen such that it is less than the forward voltage of the light-emitting diodes. Since the value of the resistor is known, a measurement of the voltage drop between the contacts 712 and 711' makes it possible to verify whether the connection was successful. Following the correct and verified connection of the connector and the printed circuit, in a second step corresponding to the operation of the lighting module in question, the electrical potential difference applied between the contacts 711 and 711' is high enough for an electric current to flow through the light-emitting diodes. After the diagnosis, a low-strength electric current flows through the second subcircuit.

Figure 9:
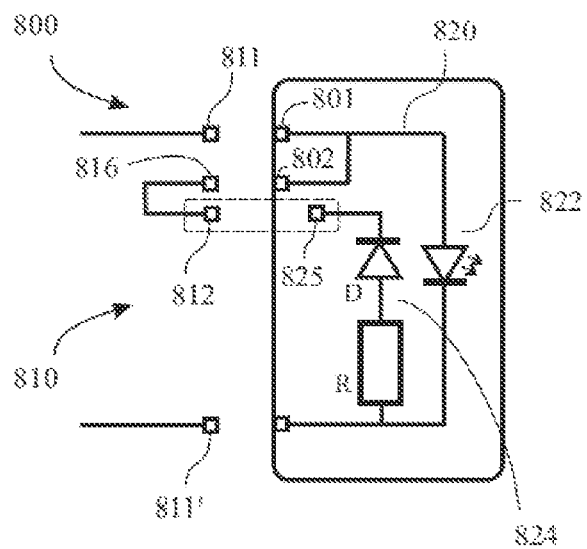
FIG. 9 schematically shows a connection device in accordance with one preferred embodiment of the invention.

The embodiment of FIG. 9 is similar to the embodiment of FIG. 7, and the same reference numerals apply by adding 200 per instance. The difference between the two embodiments is at the splicing of the contact 611. In the embodiment, the corresponding contact 811 is connected to a first terminal 801, which is connected, by an electrically conductive track of the printed circuit 820, to a second terminal 802. The second terminal is in contact with a connector 816 of the connector 810, which is shorted on the verification contact 812. This arrangement makes it possible to produce the verification contact 812 at the same potential carried by the contact 811 without having to resort to splicing. This connection alternative applies to all of the described embodiments that involve a splice at the verification contact.

Figure 10:
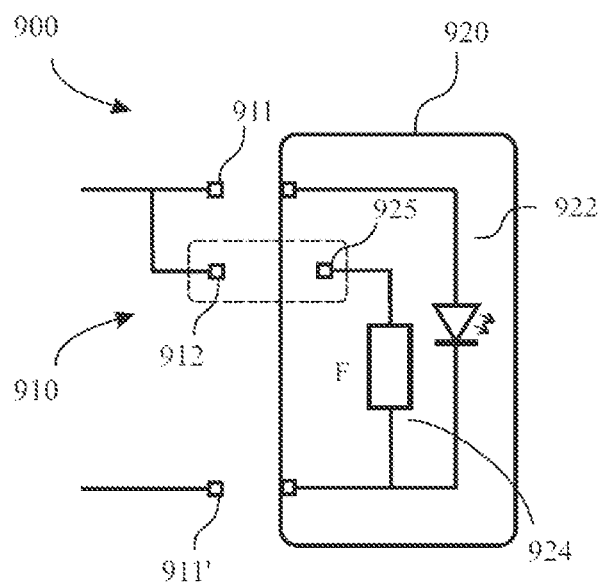
FIG. 10 schematically shows a connection device in accordance with one preferred embodiment of the invention.

The illustration of FIG. 10 shows an electrical connection assembly 900 according to a ninth preferred embodiment of the invention. The assembly comprises a connector or a plug 910 that typically marks the termination of a connection harness and that comprises a plurality of electrical contacts 911, 911', and also a verification contact 912 intended to transmit an electrical signal for verifying the electrical connection between the connector and a printed circuit. In the example shown, on one of the contacts 911 shown at the top of the figure, a splice is made in order to generate the contact 912 at the same electrical potential. The assembly 900 also comprises a printed circuit 920, for example a PCB ("printed circuit board"), without being limited to this example. A first electronic subcircuit 922 comprises at least one light-emitting diode that actively contributes to performing a lighting function for a motor vehicle. The first subcircuit is supplied with power by a potential difference between the contacts 911 and 911'. The printed circuit 920 furthermore comprises a second electronic subcircuit 924 whose electronic components do not actively contribute to the lighting function performed by the first subcircuit 922. The second subcircuit comprises a contact terminal 925 that is connected to the verification contact 912 in the event of correct connection between the connector 910 in the socket of the printed circuit. The second subcircuit is connected to the contact 911' through a fuse element F. This is preferably a calibrated fuse component that self-destructs when it is flowed through by an electric current of a predetermined strength. As an alternative, it may be a very thin conductive track of the printed circuit, which self-destructs by overheating upon the flow of an electric current of a predetermined strength.

During an assembly process and in particular a process of connecting the harness ending with the connector 910, on the one hand, to the printed circuit 920, on the other hand, the correct connection diagnosis is made as follows. Following the manual connection, by an operator, of the connector 910 into the socket, not illustrated, of the printed circuit, in a first step, a first potential difference of a low value is applied between the verification contact 912 and the contact 911', such that an electric current of a first, low strength, for example of the order of a few mA, flows through the second subcircuit 924. For low current strengths, the fuse acts like a resistor, and measuring the voltage drop between the contacts 912 and 911' in this phase makes it possible to conclude as to a correct connection. Following the correct and verified connection of the connector and the printed circuit, in a second step corresponding to the operation of the lighting module in question, the electrical potential applied between the contact 911 and 911' is such that an electric current flows through the light-emitting diodes. Upon initial operation of the lighting function, a second potential difference with a high value and at least equal to the forward voltage of the light-emitting diodes of the first subcircuit is applied between the contacts 911 and 911'. In light of the assembly, the same potential difference is applied between the verification contact 912 and the contact 911'. As a result, an electric current of a second, higher strength flows through the fuse F. Said fuse is calibrated so as to self-destruct upon the flow of an electric current having a threshold strength situated below the current thus generated. The fuse is destroyed upon initial operation of the lighting module. As an alternative, at the end of the diagnosis, it is possible to intentionally channel a high-strength electric current, so as to destroy the fuse independently of the initial operation of the lighting module. After the diagnosis, no further electric current is able to flow through the second subcircuit that was opened through the destruction of the fuse component.

Figure 11:
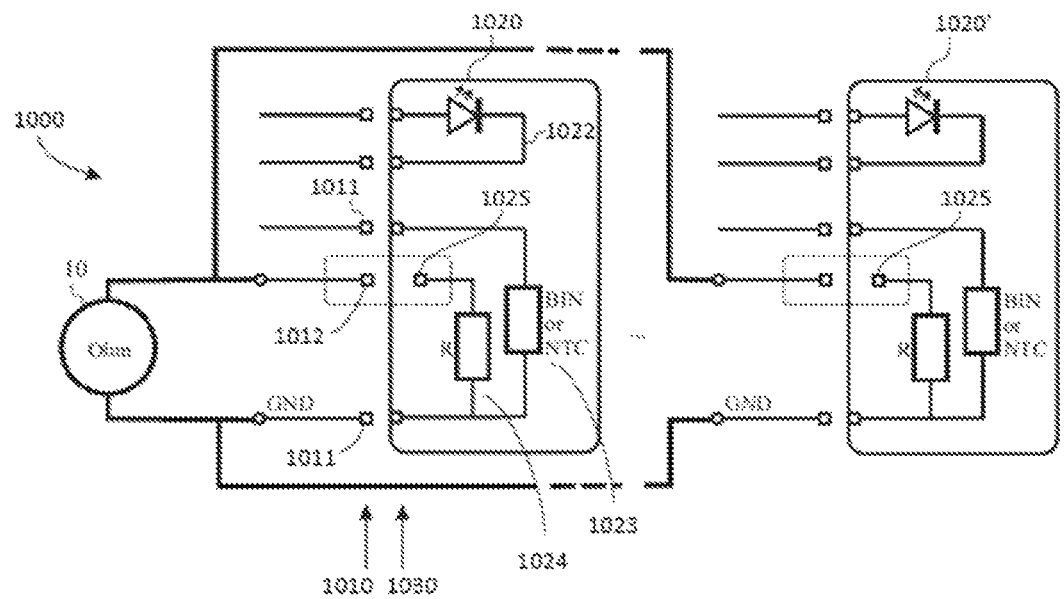
FIG. 11 schematically shows a connection device in accordance with one preferred embodiment of the invention.

The illustration of FIG. 11 shows an electrical connection assembly 1000 according to a tenth preferred embodiment of the invention. The assembly comprises a connector or a plug 1010 that typically marks the termination of a connection harness and that comprises a plurality of electrical contacts 1011, and also a verification contact 1012 intended to transmit an electrical signal for verifying the electrical connection between the connector and a printed circuit. The assembly 1000 also comprises a printed circuit 1020, for example a PCB ("printed circuit board"), without being limited to this example. The printed circuit 1020 comprises a first electronic subcircuit 1022 that actively contributes to performing a lighting function for a motor vehicle, although other applications in which the proposed connection assembly might be useful may also be contemplated. In the non-limiting example shown, the first subcircuit 1022 comprises at least one light-emitting diode, which is supplied with electric power by an electrical potential difference supplied to their terminals from an electric power supply circuit, not illustrated. It is the connector 1010, by way of the electrical contacts 1011, that makes it possible to connect the power source to the first subcircuit 1022 of the printed circuit 1020. The printed circuit 1020 furthermore comprises a second electronic subcircuit 1024 whose electronic components do not actively contribute to the lighting function performed by the first subcircuit 1022. The main function of the second subcircuit is that of electrically interacting with the verification contact, by way of a corresponding contact terminal 1025, when the connector 1010 is held by the corresponding socket 1030 installed on the printed circuit 1020. The second subcircuit comprises a contact terminal 1025 that is connected to the verification contact 1012 in the event of correct connection between the connector 1010 in the socket 1030 of the printed circuit. The second subcircuit is connected to the ground potential supplied by one of the contacts of the connector through a resistor of predetermined impedance.

As shown in FIG. 11, a lighting module for a motor vehicle may comprise a plurality 1020, 1020' of such connection assemblies. In one preferred embodiment, each of the connection assemblies comprises a second subcircuit 1024 having the same calibrated resistance R. As an alternative, each of the connection assemblies comprises a second subcircuit having a distinct calibrated resistance. In the latter case, the resistor, and more precisely the voltage drop across the edges of the resistor, makes it possible to identify the connection assembly in question.

It goes without saying that the second subcircuit may comprise more complex assemblies such as RL, RC, RLC or other circuits, provided that their electrical behavior is predetermined.

In the non-limiting example shown, the printed circuit 1020 furthermore comprises a subcircuit 1023 comprising electronic components that passively contribute to the lighting function for the motor vehicle. These are for example a resistor RBIN or a thermistor, the measurement of which is useful in a phase of calibrating the electric current supplied to light sources. The second subcircuit is independent of the other subcircuits of the printed circuit.

During an assembly process and in particular a process of connecting the harness ending with the connector 1010, on the one hand, to the printed circuit 1020, on the other hand, the correct connection diagnosis is made as follows. Following the manual connection, by an operator, of the connector 1010 into the socket 1030, a predetermined electrical verification signal is supplied by a device, not illustrated, to the verification contact 1012. If the connection is correct, the verification contact is in contact with the terminal 1025 of the second subcircuit 1024 of the printed circuit, and the electrical signal experiences a change upon passing through this subcircuit. A measuring device 10 makes it possible to measure the trend of the electrical signal thus modified and to conclude that the connection has succeeded (the verification signal has been modified in a predetermined manner) or failed (the signal has not passed through the second subcircuit 1024). Preferably, the measuring device is configured, by way of a preconfigured data processor, so as to provide a visual or auditory notification to the operator by way of an appropriate interface. The notification indicates the result of the test, thereby allowing the operator to make the connection again, if necessary. While other examples are possible, the electrical verification signal comprises for example a voltage of a predetermined strength, which experiences a drop when the electric current flows through the second circuit 1024 in the event of correct connection. This drop in electrical potential may be measured by means known in the art.

Preferably, following the manual connection, by an operator, of the connector 1010 into the socket of the printed circuit, in a first step, a first potential difference is applied between the contact 1012 and ground potential. Since the value of the calibrated resistor R is known, a measurement of the voltage drop between the contacts 1012 and GND makes it possible to verify whether the connection was successful. Following the correct and verified connection of the connector and the printed circuit, in a second step corresponding to the operation of the lighting module in question, the verification contact 1012 is no longer supplied with power and the electrical potential applied to the contact 1011 is such that either the value RBIN or the resistance of the thermistor are able to be measured, or such that the potential difference across the terminals of the first subcircuit is high enough for an electric current to flow through the light-emitting diodes.

After the diagnosis, no further electric current flows through the second subcircuit 1024. Moreover, a single connection wire may be used to connect a measuring instrument 10 in parallel with a plurality of printed circuits 1020, 1020' of a lighting module, as shown in FIG. 2. If the values of the calibrated resistors R of all of the printed circuits 1020, 1020' are identical, the equivalent resistance seen by the measuring instrument is equal to R/n, where n is the number of printed circuits in parallel. The instrument may therefore conclude and indicate the number of correct connections. As an alternative, each printed circuit 1020, 1020' has a calibrated resistor R with a different value. The measuring instrument may thus identify, through a calculation known per se in the art, which of the connections have failed or succeeded. An auditory and/or visual notification is then generated.

Figure 12:
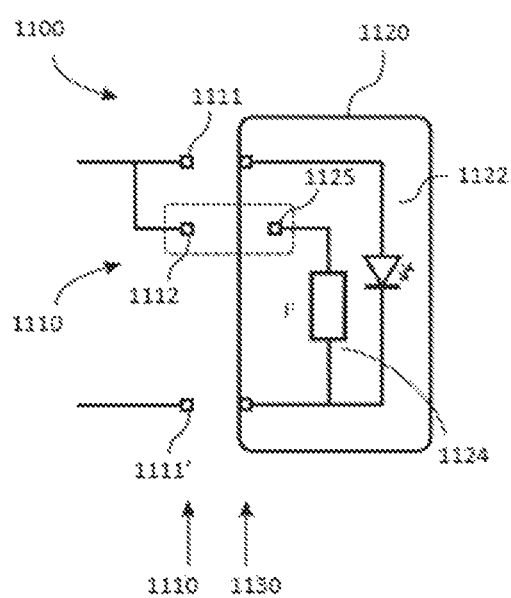
FIG. 12 schematically shows a connection device in accordance with one preferred embodiment of the invention.

The illustration of FIG. 12 shows an electrical connection assembly 1100 according to an eleventh preferred embodiment of the invention. The assembly comprises a connector or a plug 1110 that typically marks the termination of a connection harness and that comprises a plurality of electrical contacts 1111, 1111', and also a verification contact 1112 intended to transmit an electrical signal for verifying the electrical connection between the connector and a printed circuit. The assembly 1100 also comprises a printed circuit 1120, for example a PCB ("printed circuit board"), without being limited to this example. The printed circuit 1120 comprises a first electronic subcircuit 1122 that actively contributes to performing a lighting function for a motor vehicle, although other applications in which the proposed connection assembly might be useful may also be contemplated. In the non-limiting example shown, the first subcircuit 1122 comprises light-emitting diodes, which are supplied with electric power by an electrical potential difference supplied to their terminals from an electric power supply circuit, not illustrated. It is the connector 1110, by way of the electrical contacts 1111, that makes it possible to connect the power source to the first subcircuit 1122 of the printed circuit 1120. The printed circuit 1120 furthermore comprises a second electronic subcircuit 1124 whose electronic components do not actively contribute to the lighting function performed by the first subcircuit 1122. The main function of the second subcircuit is that of electrically interacting with the verification contact, by way of a corresponding contact terminal 1125, when the connector 1110 is held by the corresponding socket 1130 installed on the printed circuit 1120.

In the example shown, on one of the contacts 1111 shown at the top of the figure, a splice is made in order to generate the contact 1112 at the same electrical potential. Any other arrangement having the effect of carrying the potential of the contact 1111 over onto the verification contact 1112 is assumed to be equivalent. The first subcircuit is supplied with power by a potential difference between the contacts 1111 and 1111'. The second subcircuit comprises a contact terminal 1125 that is connected to the verification contact 1112 in the event of correct connection between the connector 1110 in the socket 1130 of the printed circuit. The second subcircuit is connected to the contact 1111' through a fuse element F. This is preferably a calibrated fuse component that self-destructs when it is flowed through by an electric current of a predetermined strength. As an alternative, it may be a very thin conductive track of the printed circuit or a resistive component that self-destructs by overheating upon the flow of an electric current of a predetermined strength.

During an assembly process and in particular a process of connecting the harness ending with the connector 1110, on the one hand, to the printed circuit 1120, on the other hand, the correct connection diagnosis is made as follows. Following the manual connection, by an operator, of the connector 1110 into the socket 1130, a predetermined electrical verification signal is supplied by a device, not illustrated, to the verification contact 1112. If the connection is correct, the verification contact is in contact with the terminal 1125 of the second subcircuit 1124 of the printed circuit, and the electrical signal experiences a change upon passing through this subcircuit. A measuring device, not illustrated, makes it possible to measure the trend of the electrical signal thus modified and to conclude that the connection has succeeded (the verification signal has been modified in a predetermined manner) or failed (the signal has not passed through the second subcircuit 1124). Preferably, the measuring device is configured, by way of a preconfigured data processor, so as to provide a visual or auditory notification to the operator by way of an appropriate interface. The notification indicates the result of the test, thereby allowing the operator to make the connection again, if necessary. While other examples are possible, the electrical verification signal comprises for example a voltage of a predetermined strength, which experiences a drop when the electric current flows through the second circuit 1124 in the event of correct connection. This drop in electrical potential may be measured by means known in the art.

More specifically, following the manual connection, by an operator, of the connector 1110 into the socket 1130 of the printed circuit 1120, in a first step, a first potential difference of a low value is applied between the verification contact 1112 and the contact 1111', such that an electric current of a first, low strength, for example of the order of a few mA, flows through the second subcircuit 1124. For low current strengths, the fuse acts like a resistor, and measuring the voltage drop between the contacts 1112 and 1111' in this phase makes it possible to conclude as to a correct connection. The electric current does not have enough strength for the operation of the light sources of the first subcircuit 1122. For example, it is lower than the value of the charging current of the light-emitting diodes of the first subcircuit 1122. Following the correct and verified connection of the connector and the printed circuit, in a second step corresponding to the operation of the lighting module in question, the electrical potential applied between the contact 1111 and 1111' is such that an electric current of greater strength flows through the light-emitting diodes. Upon initial operation of the lighting function, a second potential difference with a high value and at least equal to the forward voltage of the light-emitting diodes of the first subcircuit is applied between the contacts 1111 and 1111'. In light of the assembly, the same potential difference is applied between the verification contact 1112 and the contact 1111'. As a result, an electric current of a second, higher strength greater than the self-destruction threshold value flows through the fuse component F. Said fuse is calibrated so as to self-destruct upon the flow of an electric current having a threshold strength situated below the current thus generated. The fuse burns out upon initial operation of the lighting module. After the diagnosis, no further electric current is able to flow through the second subcircuit that was opened through the destruction of the fuse component.

In all embodiments, a diagnostic device, comprising a measuring instrument and also an auditory and/or visual feedback device, such as a loudspeaker and/or a screen, may be provided in order to implement the diagnostic method. This is preferably a computer having corresponding interfaces, a memory element and also a processor programmed to perform the various steps described in each embodiment. Preferably, the diagnostic device is connected to the various printed circuits for which the connection to the respective connector is to be tested, without passing via circuits for driving the supply of electric power to said printed circuits.

It goes without saying that the described embodiments do not limit the scope of protection of the invention. By referring to the description that has just been given, other embodiments may be contemplated without otherwise departing from the scope of the present invention.

The scope of protection is defined by the claims.

What is claimed is:

1. An electrical connection assembly comprising:
a connector and a printed circuit, with the printed circuit including a socket corresponding to the connector and a first electronic subcircuit that contributes to performing a lighting function for a motor vehicle, with the connector including a verification contact intended to transmit an electrical signal for verifying the electrical connection between the connector and the printed circuit, wherein the printed circuit comprises a second subcircuit having a contact terminal intended to be connected to the verification contact in the event of the connector being held in the socket.

2. The connection assembly as claimed in claim 1, wherein the connector and the socket comprise a mutual mechanical engagement structure, which makes it possible to produce a first mechanical engagement corresponding to a first, lesser degree, and a second mechanical engagement corresponding to a second, greater degree of pushing of the connector into the socket, and in that the arrangement of the verification contact and of the contact terminal of the second subcircuit is such that they are in electrical contact if the second mechanical engagement of the structure is engaged.

3. The connection assembly as claimed in claim 1, wherein the socket comprises a plurality of contacts extending over a first length, and in that the contact terminal extends over a second length, with the second length being shorter than the first length.

4. The connection assembly as claimed in claim 1, wherein the first subcircuit comprises at least one electroluminescent semiconductor element-based light source.

5. The connection assembly as claimed in claim 1, wherein the second subcircuit is arranged so as to be connected to a ground potential when the connector is plugged into the socket.

6. The connection assembly as claimed in claim 1, wherein the second subcircuit is arranged so as to connect the contact terminal to a ground potential through at least one branch that comprises a capacitor, an inductor, a resistor, or a combination of the above.

7. The connection assembly as claimed in claim 1, wherein the connector comprises a first contact intended to supply a first non-zero electrical potential to the first subcircuit, and a second contact intended to supply a second non-zero electrical potential to the first subcircuit, and in that the arrangement is such that the contact terminal is connected to the first electrical potential when the connector is plugged into the socket.

8. The connection assembly as claimed in claim 7, wherein the second subcircuit is connected to the second non-zero electrical potential when the connector is plugged into the socket.

9. The connection assembly as claimed in claim 1, wherein the second subcircuit includes a resistive component.

10. The connection assembly as claimed in claim 1, wherein the second subcircuit includes a fuse.

11. The connection assembly as claimed in claim 1, wherein the second subcircuit is arranged so as to connect the contact terminal to a ground potential through a branch including a resistive component.

12. The connection assembly as claimed in claim 1, wherein the second subcircuit includes an electronic component intended to self-destruct upon the flow of an electric current having at least a predetermined threshold strength.

13. A lighting module for a motor vehicle, comprising a plurality of connection assemblies as claimed in claim 1.

14. A method for diagnosing the connection between a connector and a printed circuit forming a connection assembly, the method comprising:
    making available a connection between the connector and the printed circuit;
    providing an electrical verification signal, having first characteristics, at a verification contact;
    using a measuring instrument to measure an output electrical signal from a second subcircuit of the printed circuit;
    using a data processing unit to compare the verification signal and the output signal, and to conclude as to a correct or incorrect connection depending on the result of the comparison.

15. A method for diagnosing connections between respective connectors and printed circuits of a lighting module, comprising:
    making available a connection between the connectors and the printed circuits;
    providing an electrical verification signal, having first characteristics, at a verification contact of each connection assembly;
    using a measuring instrument to measure an electrical signal from a second subcircuit of each printed circuit;
    using a data processing unit to compare the verification signal and the output signal, and to conclude as to a correct or incorrect connection of the printed circuits depending on the result of the comparison.

* * * * *